United States Patent
Chou et al.

(10) Patent No.: US 8,719,755 B2
(45) Date of Patent: May 6, 2014

(54) GRADED DUMMY INSERTION

(75) Inventors: Wen-Shen Chou, Zhubei (TW);
Yung-Chow Peng, Hsin-chu (TW);
Chih-Chiang Chang, Taipei (TW);
Chin-Hua Wen, Toufen (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 13/562,638

(22) Filed: Jul. 31, 2012

(65) Prior Publication Data
US 2014/0040836 A1 Feb. 6, 2014

(51) Int. Cl.
*G06F 17/50* (2006.01)
(52) U.S. Cl.
USPC .............................. 716/122; 716/52; 716/119
(58) Field of Classification Search
USPC .............................. 716/52, 118, 122, 124, 125
See application file for complete search history.

(56) References Cited

U.S. PATENT DOCUMENTS

| | | | | |
|---|---|---|---|---|
| 5,963,975 | A * | 10/1999 | Boyle et al. | 711/147 |
| 7,849,436 | B2 * | 12/2010 | Young | 716/53 |
| 7,996,813 | B2 * | 8/2011 | Hatano et al. | 716/139 |
| 2007/0174802 | A1 * | 7/2007 | Shin et al. | 716/8 |
| 2008/0003734 | A1 * | 1/2008 | Chuang et al. | 438/199 |
| 2008/0038847 | A1 * | 2/2008 | Young | 438/5 |
| 2008/0203589 | A1 * | 8/2008 | Bailey et al. | 257/797 |
| 2010/0115479 | A1 * | 5/2010 | Hatano et al. | 716/4 |
| 2011/0204470 | A1 * | 8/2011 | Cheng et al. | 257/499 |
| 2011/0289470 | A1 * | 11/2011 | Bickford et al. | 716/132 |
| 2011/0291285 | A1 * | 12/2011 | Ueberreiter et al. | 257/773 |
| 2012/0295187 | A1 * | 11/2012 | Tsai et al. | 430/5 |

OTHER PUBLICATIONS

Drennan, et al., "Implications of Proximity Effects for Analog Design", IEEE 2006 Custom Integrated Circuits Conference (CICC), 2006, pp. 1-8, http://www.solidodesign.com/uploads/1_drennan_cicc06_v3f.pdf.

* cited by examiner

*Primary Examiner* — Jack Chiang
*Assistant Examiner* — Brian Ngo
(74) *Attorney, Agent, or Firm* — Cooper Legal Group LLC

(57) ABSTRACT

Among other things, one or more techniques for graded dummy insertion and a resulting array are provided herein. For example an array is a metal oxide semiconductor (MOS) array, a metal oxide metal (MOM) array, or a resistor array. In some embodiments, a first region and a second region are identified based on a density gradient between a first pattern density associated with the first region and a second pattern density associated with the second region. For example, the first pattern density and the second pattern density are gate densities and/or poly densities. To this end, a dummy region is inserted between the first region and the second region, the dummy region includes a graded pattern density based on a first adjacent pattern density and a second adjacent pattern density. In this manner, graded dummy insertion is provided, thus enhancing edge cell performance for an array, for example.

20 Claims, 10 Drawing Sheets

GRADED DUMMY INSERTION

BACKGROUND

Generally, a semiconductor device comprises an array, one or more regions, and one or more logic cells. The array generally comprises a metal oxide semiconductor (MOS) array, a metal oxide metal (MOM) array, or a resistor array. For example, the semiconductor device comprises active cells and surrounding patterns which surround at least some of the active cells. However, an active cell at an edge of a region of active cells and a region of surrounding patterns generally suffers from performance issues associated with an edge effect for arrays. For example, chemical-mechanical planarization (CMP) associated with fabrication of an array generally introduces performance issues causing undesirable device variation. Moreover, buffers associated with the array of the semiconductor device occupy space on the device in an undesirable manner.

SUMMARY

This summary is provided to introduce a selection of concepts in a simplified form that are further described below in the detailed description. This summary is not intended to be an extensive overview of the claimed subject matter, identify key factors or essential features of the claimed subject matter, nor is it intended to be used to limit the scope of the claimed subject matter.

Among other things, one or more techniques and/or systems for graded dummy insertion and/or a resulting array are provided herein. In an example, the array comprises a metal oxide semiconductor (MOS) array, a metal oxide metal (MOM) array, or a resistor array. Accordingly, it will be appreciated that the MOS array, the MOM array, and the resistor array are merely examples of arrays, and other types of arrays are possible. Generally, an array comprises one or more regions, and respective regions comprise one or more logic cells. In some embodiments, graded dummy insertion is provided by identifying a first region and a second region based at least in part on a density gradient between a first pattern density associated with the first region and a second pattern density associated with the second region and inserting a dummy region between the first region and the second region, the dummy region comprising a graded pattern density based at least in part on a first adjacent pattern density and a second adjacent pattern density. In an example, one or more additional dummy regions is inserted between the dummy region and the second region, and respective additional dummy regions comprise respective additional graded pattern densities such that the additional graded pattern densities are based at least in part on pattern densities of regions adjacent to the respective additional dummy regions. In this manner, graded dummy insertion is provided. To this end, a size of a buffer region associated with a distance from the first region to the second region is reduced at least because the graded dummy insertion provides for a reduced density gradient between the first region and the second region.

The following description and annexed drawings set forth certain illustrative aspects and implementations. These are indicative of but a few of the various ways in which one or more aspects are employed. Other aspects, advantages, and/or novel features of the disclosure will become apparent from the following detailed description when considered in conjunction with the annexed drawings.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

Figure 1:
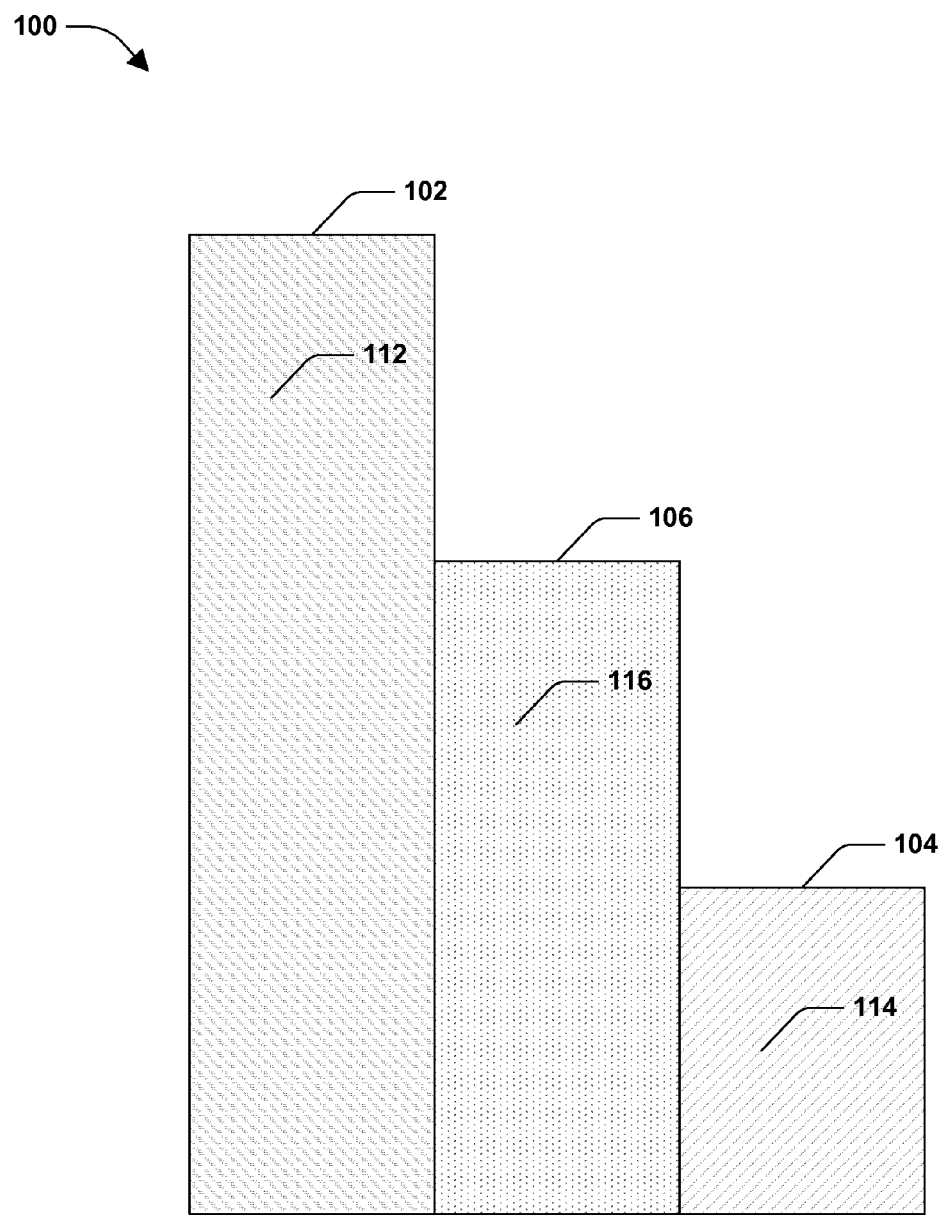
FIG. 1 is a cross-sectional view of an example array enhanced with graded dummy insertion, according to various embodiments.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter.

According to an aspect, as provided herein, graded dummy insertion is provided by identifying a first region and a second region based at least in part on a density gradient between a first pattern density associated with the first region and a second pattern density associated with the second region and inserting a dummy region between the first region and the second region, the dummy region comprising a graded pattern density based at least in part on a first adjacent pattern density and a second adjacent pattern density. Therefore, a dummy insertion utility is provided to enable insertion of dummy regions based at least in part on adjacent pattern densities. In this manner, graded dummy insertion enables mitigation of device variation such that a density gradient between a region comprising active cells and a region comprising surrounding patterns is reduced. To this end, a size of a buffer zone associated with a distance from a first region to a second region, such as a dummy region is reduced, thus enabling an efficient space layout.

It will be appreciated that the following Figures are not drawn to scale. For example, the arrays illustrated in FIG. 1, FIG. 2, and FIG. 3, such as, but not limited to first region 102 and/or first array 102, second region 104 and/or second array 104, dummy region 106, dummy region 206, additional dummy region 208, and/or dummy region 302 are not necessarily illustrated with respective heights to scale. In an example, the first region 102 and/or the first array 102 is illustrated with a height greater than a height of the second region 104 and/or the second array 104 at least because a first pattern density 112 is greater than a second pattern density 114.

FIG. 1 is a cross-sectional view of an example array 100 enhanced with graded dummy insertion, according to various embodiments. In some embodiments, array 100 comprises a first array 102 and a second array 104. In some embodiments, the first array 102 is associated with a first pattern density 112 and the second array 104 is associated with a second pattern density 114. For example, the first array 102 comprises active cells. In another example, the first array 102 comprises active cells and dummy cells. According to one aspect, at least some of the dummy cells facilitate protection of the active cells from edge effects and/or device variation effects. To this end, the first array 102 is associated with a first pattern density 112, such as a first gate density of the first array 102. For example, a gate density and/or a pattern density is calculated by determining a total gate area for a sample area and dividing the total gate area by the sample area. That is, for example, looking at the first array 102 from a layout and/or top down view, if a sample area of 1000 um$^2$ is examined, and gates within the sample area are determined to comprise an area of 500 um$^2$, the first array 102 comprises a first pattern density 112 of 50% at least because 500 um$^2$/1000 um$^2$=50%.

In some embodiments, the second array 104 comprises surrounding patterns. Additionally, the surrounding patterns of the second array 104 comprise a second pattern density 114, such as a second gate density of the second array 104. In an example, the second array 104 comprises a gate density of 25%. Accordingly, a density gradient is determined by subtracting the gate density of the second array from the gate density of the first array. In an aspect, the density gradient is determined by subtracting the pattern density of the second array from the pattern density of the first array. In this example, the density gradient is 25% at least because 50%−25%=25%. In some embodiments, a dummy region 106 is inserted between the first array 102 and the second array 104. According to an aspect, the dummy region 106 comprises a graded pattern density 116 based at least in part on a first adjacent pattern density associated with a first adjacent region and a second adjacent pattern density associated with a second adjacent region, the first adjacent region and the second adjacent region adjacent to the dummy region 106. For example, the graded pattern density 116 is 37.5% at least because the graded pattern density 116 is based at least in part on a linear function associated with the first pattern density 112 and the second pattern density 114. In this example, the first adjacent pattern density is the first pattern density 112, the second adjacent pattern density is the second pattern density 114, the first adjacent region is the first array 102, and the second adjacent region is the second array 104. However, it will be appreciated that in other embodiments, the first adjacent pattern density, the second adjacent pattern density, the first adjacent region, and the second adjacent region are other regions. For example, if additional dummy regions are inserted, the adjacent pattern densities and/or adjacent regions are regions and/or pattern densities that may not be associated with the first array 102 and the second array 104, depending on a number of additional dummy regions. It will be appreciated that the graded pattern density 116 is based on a non-linear function in other examples. In some embodiments, the graded pattern density 116 is based on a curve function, a log function, or a function of a distance between the first array 102 and the second array 106.

Figure 2:
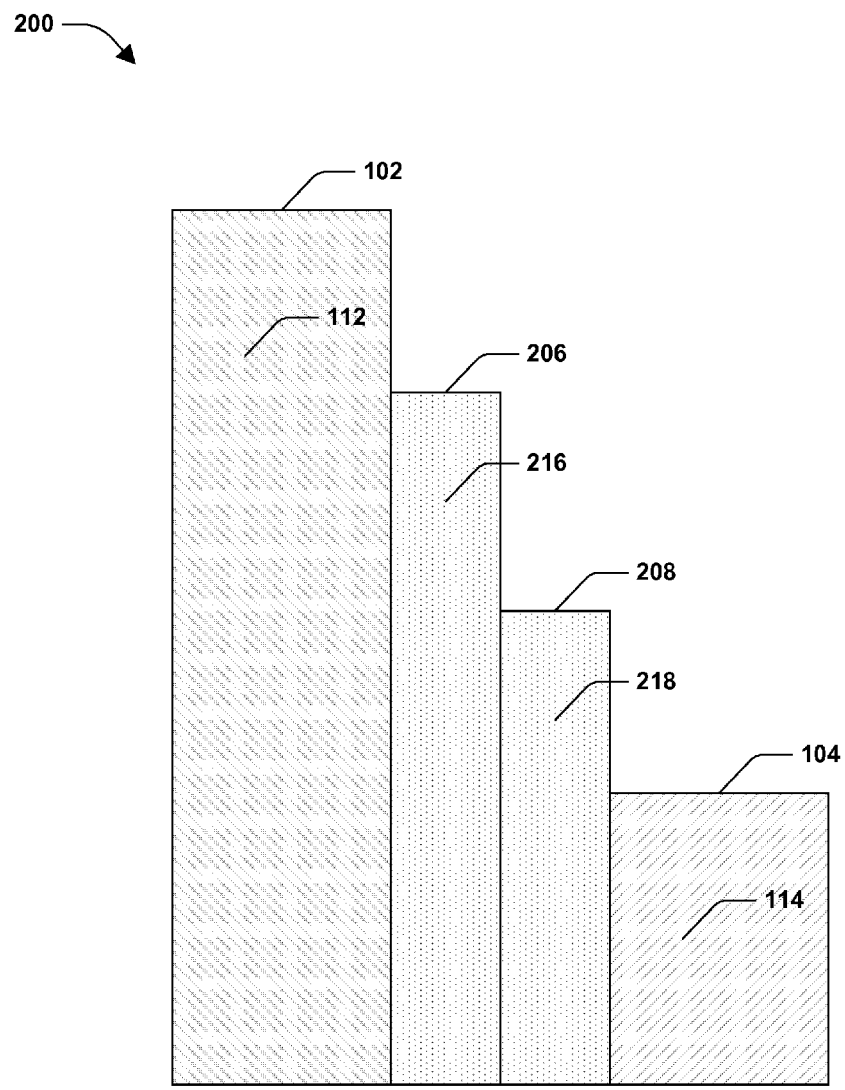
FIG. 2 is a cross-sectional view of an example array enhanced with graded dummy insertion, according to various embodiments.

FIG. 2 is a cross-sectional view of an example array 200 enhanced with graded dummy insertion, according to some embodiments. The array 200 of FIG. 2 comprises a first array 102 associated with a first pattern density 112, a second array 104 associated with a second pattern density 114, and a dummy region 206 between the first array 102 and the second array 104. In some embodiments, the dummy region 206 comprises a graded pattern density 216 based at least in part on a first adjacent pattern density associated with a first adjacent region and a second adjacent pattern density associated with a second adjacent region, where the first adjacent region and the second adjacent region are adjacent to the dummy region. For example, the first adjacent pattern density is the first pattern density 112, the second adjacent pattern density is an additional graded pattern density 218 associated with an additional dummy region 208, the first adjacent region is the first array 102, and the second adjacent region is the additional dummy region 208. In this example, an additional dummy region 208 is inserted between the dummy region 206 and the second array 104, such that the additional dummy region 208 comprises the additional graded pattern density 218 based at least in part on pattern densities of regions adjacent to the additional dummy region 208. Therefore, in this example, pattern densities of regions adjacent to the additional dummy region are second pattern density 114 of the second array 104 and the graded pattern density 216 of the dummy region 206.

According to an aspect, the graded pattern density 216 of the dummy region 206 is based at least in part on a linear function associated with the first pattern density 112 and the second pattern density 114. In an example, if the first pattern density 112 is 50% and the second pattern density 114 is 25%, the graded pattern density 216 is calculated accordingly. In some embodiments, the graded pattern density 216 is based at least in part on a number of dummy regions, a width associated with a dummy region, and/or a design rule. In an example, a delta between arrays and/or regions is calculated according to (second pattern density−first pattern density)/(1+number of dummy regions between the first array and the second array). Therefore, the graded pattern density of a dummy region adjacent to the first array=the first pattern density−delta*dummy region number. For example, the dummy region number for the dummy region adjacent to the first region is "1", the dummy region number for the additional dummy region adjacent to the second region is "2", etc.

Figure 3:
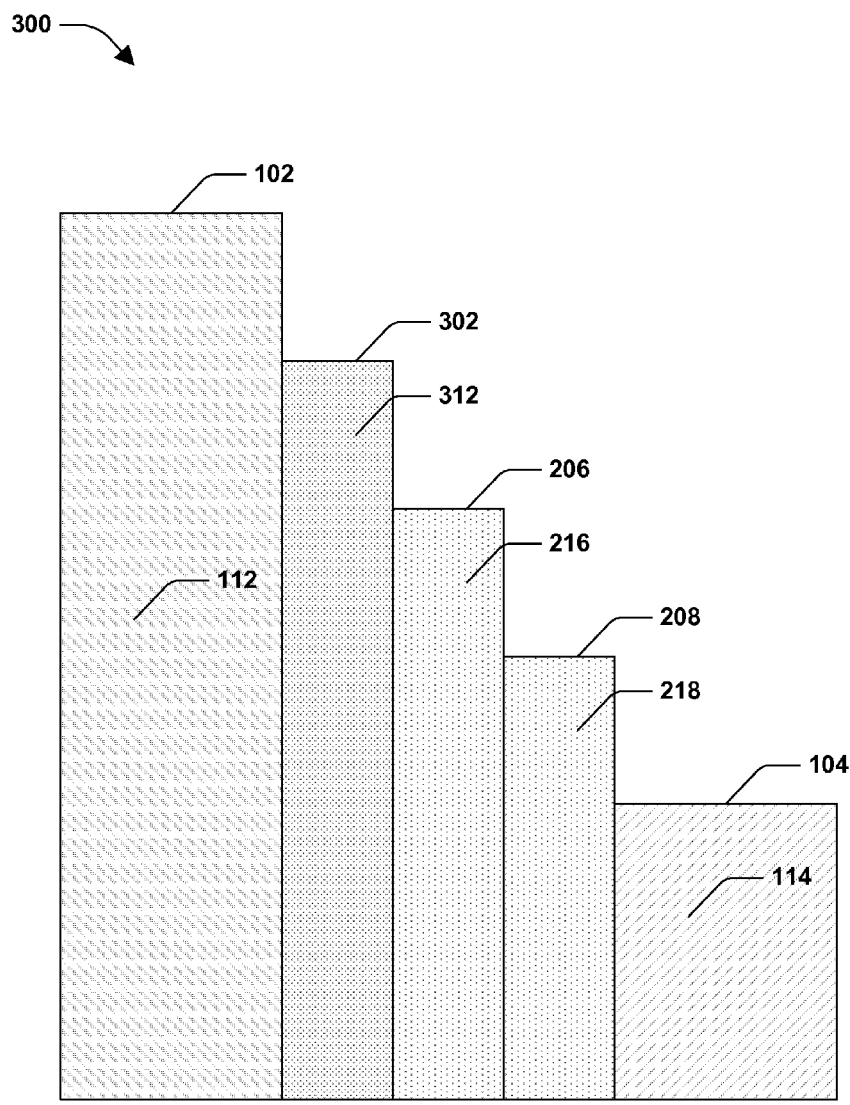
FIG. 3 is a cross-sectional view of an example array enhanced with graded dummy insertion, according to various embodiments.

FIG. 3 is a cross-sectional view of an example array 300 enhanced with graded dummy insertion, according to some embodiments. For example, the array 300 of FIG. 3 comprises a first region such as a first array 102 comprising a first pattern density 112. Array 300 comprises a dummy region 302 comprising a graded pattern density 312, a first additional dummy region 206 comprising a first additional graded pattern density 216, and a second additional dummy region 208 comprising a second additional graded pattern density 218. Additionally, array 300 comprises a second dummy region such as a second array 104 comprising a second pattern density 114. It will be appreciated that the aforementioned pattern densities are gate densities, according to some embodiments. In some other embodiments, a pattern density is a metal layer pattern density for a MOM array, for example. Accordingly, a pattern density is not necessarily limited to a gate density or a metal layer density, and it will be appreciated that the pattern density merely refers to a density of a pattern, such as a pattern within a semiconductor fabrication environment. In some embodiments, the first pattern density 112 and the graded pattern density 312 are substantially the same. In some other embodiments, the graded pattern density 312=the first pattern density 112−a delta. In some embodiments, the delta=(first pattern density−second pattern density)/(1+number of dummy regions). Therefore, if the first pattern density is 50% and the second pattern density is 25%, delta=6.25% and the graded pattern density 312 is 43.75% for the dummy region 302. Accordingly, the first additional dummy region 206 comprises a first additional graded pattern density 216 of 37.5% and the second additional dummy region 208 comprises a second additional graded pattern density 218 of 31.25%. In other embodiments, the graded pattern densities are calculated based on other functions, such as a width of a dummy region, for example.

Figure 4:
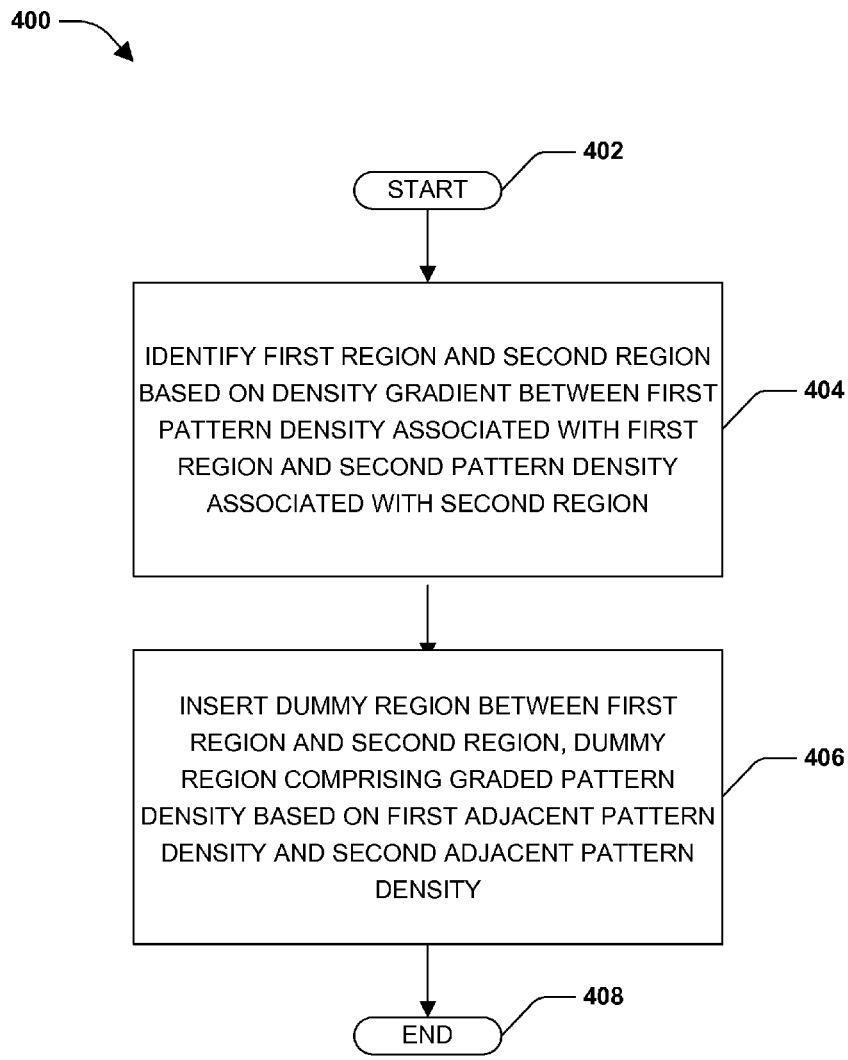
FIG. 4 is a flow diagram of an example method for graded dummy insertion, according to various embodiments.

FIG. 4 is a flow diagram of an example method 400 for graded dummy insertion, according to various embodiments. At 402, the method 400 begins, and at 404, a first region and a second region are identified based at least in part on a density gradient between a first pattern density associated with the first region and a second pattern density associated with the second region. According to an aspect, a pattern density is a ratio, such as a gate area versus total area ratio determined from a layout view of a semiconductor device. In some embodiments, a pattern density is a gate density based on a ratio of gate area of a sample area with respect to a total sample area size. In an example embodiment, the density gradient is determined by subtracting the second pattern density from the first pattern density. In other words, the density gradient is a difference between pattern densities of two different areas.

At 406, a dummy region is inserted between the first region and the second region, the dummy region comprising a graded pattern density based at least in part on a first adjacent pattern density and a second adjacent pattern density. It will be appreciated that in some examples, the first adjacent pattern density is the first pattern density and the second adjacent pattern density is the second pattern density. However, in some other embodiments, the first adjacent pattern density is merely a pattern density associated with a first adjacent region and the second adjacent pattern density is merely a pattern density associated with a second adjacent region. In some embodiments, the dummy region is inserted based at least in part on a density gradient threshold. For example, a density gradient threshold is a threshold associated with the density gradient such that the dummy region is inserted if the density gradient is greater than the density gradient threshold. In some embodiments, the density gradient threshold is ten. To this end, a density gradient between a first region and a second region is calculated by subtracting the second adjacent pattern density from the first adjacent pattern density, and if the density gradient is greater than ten, the dummy region is inserted between the first region and the second region. If the density gradient is less than ten, no dummy region is inserted between the first region and the second region.

In some embodiments, one or more additional dummy regions are inserted between the dummy region and the second region. For example, the respective additional dummy regions comprise respective additional graded pattern densities, and the additional graded pattern densities are based at least in part on pattern densities of regions adjacent to the respective additional dummy regions. For example, if an array comprises a first region of active cells comprising a first pattern density and a second region of surrounding patterns comprising a second pattern density, three dummy regions are inserted between a first region comprising the first array of active cells and a second region comprising the surrounding patterns. According to some embodiments, a density gradient is determined by at least one of subtracting the first pattern density from the second pattern density or subtracting the second pattern density from the first pattern density. In this example, the first region borders a first dummy region, followed by a second dummy region, a third dummy region, and the second region. Accordingly, the additional graded pattern density of the first dummy region is based on the pattern density of the first region and the second dummy region at least because the first region and the second dummy region are adjacent to the first dummy region. Additionally, the additional graded pattern density of the second dummy region is based on the additional graded pattern density of the first dummy region and the additional graded pattern density of the third dummy region at least because the first dummy region and the third dummy region are adjacent to the second dummy region. The additional graded pattern density of the third dummy region is based on the additional graded pattern density of the second dummy region and the pattern density of the second region at least because the second region and the second dummy region are adjacent to the third dummy region.

In an example, graded pattern densities are based at least in part on a linear function associated with a first pattern density of the first region and a second pattern density of the second region. In some examples, the first pattern density is a first gate density and the second pattern density is a second gate density. For example, a pattern density is a gate density, calculated by dividing a gate area within a sample area by the sample area. In other words, a gate density is a ratio of gate area with respect to a sample area. For example, if a sample area is 100 um$^2$, and a total gate area within the sample area is 60 um$^2$, 60 um$^2$/100 um$^2$=a 60% gate density. For example, if an array comprises a first region comprising a gate density of fifty percent and a second region comprising a gate density of twenty five percent, a dummy region inserted between the first region and the second region comprises a thirty seven and one-half percent gate density at least because a linear function associated with 50% and 25% maps to 37.5% based on an example of a one step graded dummy insertion. In some embodiments, a delta in pattern density between regions is calculated by (first pattern density−second pattern density)/(a number of desired graded dummy insertion regions+1). For example, if three dummy regions are inserted between a first region comprising a first pattern density of 50% and a second region comprising a second pattern density of 25%, a first dummy region comprises a pattern density of 50−(50−25)/4=43.75%, a second dummy region comprises a pattern density of 50−2*(50−25)/4=37.5%, and a third dummy region comprises a pattern density of 50−3*(50−25)/4=31.25%, followed by the second region comprising the second pattern density of 25%. In some embodiments, a computer aided design (CAD) layer is created and/or associated with at least one of the first region, the second region, the dummy region, and/or at least some of the additional dummy regions. At 408, the method 400 ends.

Figure 5:
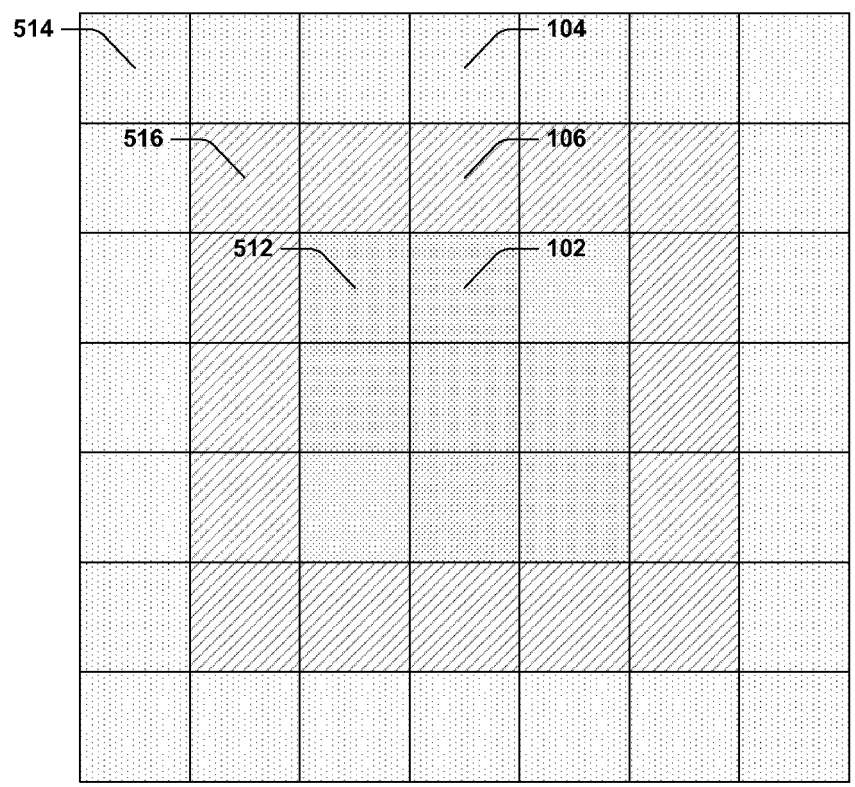
FIG. 5 is a top-down and/or layout view of an example array enhanced with graded dummy insertion, according to various embodiments.

FIG. 5 is a top-down and/or layout view of an example array 500 enhanced with graded dummy insertion, according to some embodiments. In some embodiments, the array 500 comprises a first region 102, a second region 104, and a dummy region 106 inserted between the first region 102 and the second region 104. It will be appreciated that the dummy region is at an angle relative to other portions of the first region 102 and other portions of the second region 104 in some embodiments. For example, first region 512 and second region 514 are at least partly separated by dummy region 516, and comprise a different orientation than the first region 102 and the second region 104. Accordingly, the first regions 102 and 512, the second regions 104 and 514, and the dummy regions 106 and 516 are associated with pattern densities and/or gate densities described in further detail herein.

In some embodiments, a computer aided design (CAD) layer is created for at least one of the first region 102 and 512, the second region 104 and 514, and/or the dummy region 106 and 516. To this end, a design rule check (DRC) is run on a region and/or an associated pattern density to determine compliance with a design rule. In an example, the design rule specifies that the dummy region 106 and 516 comprises a width less than 15 um. In some embodiments, the design rule specifies that a density gradient between the first region 102 and 512 and the dummy region 106 and 516 is less than 10% or an additional dummy region is inserted between the first region 102 and 512 and the dummy region 106 and 516. In some embodiments, a dummy insertion tool is configured to identify one or more regions and/or one or more arrays associated with potential edge effects and/or device variation based at least in part on a density gradient. In some embodiments, the dummy insertion tool is configured to adjust a width of the dummy region 106 and 516 based at least in part on an edge effect simulation and/or a device variation simulation. For example, the dummy insertion tool reduces the width of dummy region 106 such that the first region 102 and the second region 104 are closer together.

In some embodiments, the dummy insertion tool is configured to identify a first region and a second region based at least in part on a density gradient between a first pattern density associated with the first region and a second pattern density associated with the second region. The dummy insertion tool is configured to insert a dummy region between the first region and the second region, the dummy region comprising a graded pattern density based at least in part on a first adjacent pattern density and a second adjacent pattern density. In some embodiments, the dummy insertion tool is implemented at least in part via a processing unit.

Figure 6:
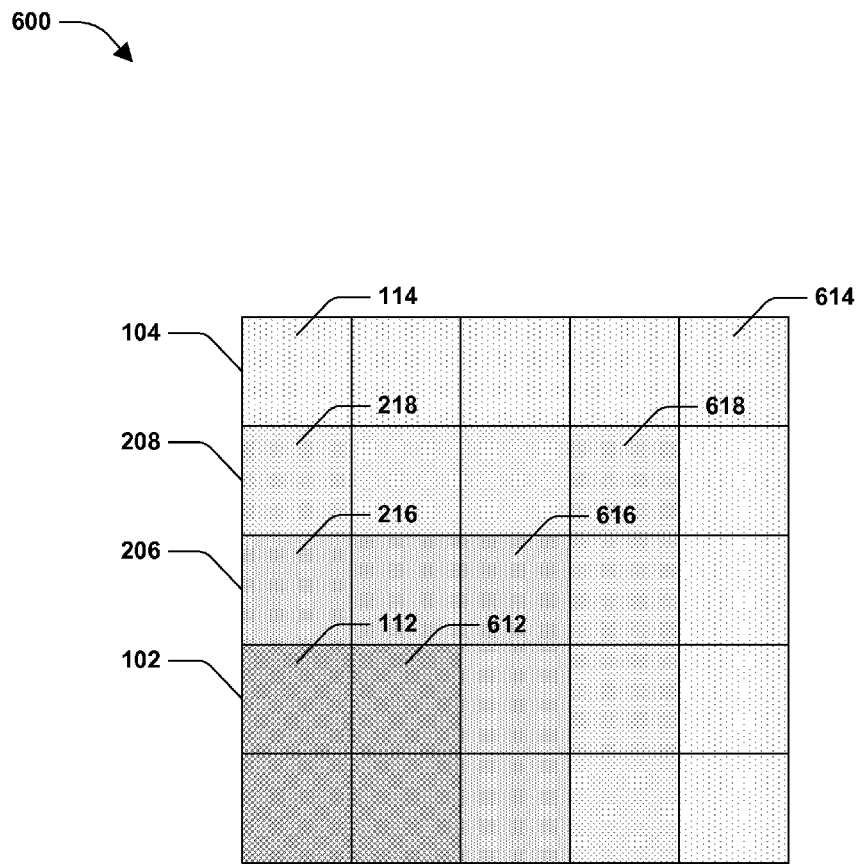
FIG. 6 is a top-down and/or layout view of an example array enhanced with graded dummy insertion, according to various embodiments.

In some embodiments, the dummy insertion tool is configured to insert additional dummy regions and/or additional "steps" based at least in part on a density gradient. FIG. 6 is a top-down and/or layout view of an example array 600 enhanced with graded dummy insertion, according to some embodiments. For example, FIG. 6 illustrates an array 600 comprising two "steps", such as two dummy regions between a first region 102 and 612 and a second region 104 and 614. In some embodiments, the array 600 comprises a first region 102, a second region 104, a dummy region 206, and an additional dummy region 208. At 112, 216, 218, and 114, respective pattern densities for the first region 102, the dummy region 206, the additional dummy region 208, and the second region 204 are indicated. Additionally, 112, 216, 218, and 114 are indicative of pattern densities for the first region 612, the dummy region 616, the additional dummy region 618, and the second region 614.

In other embodiments, the array 600 comprises a first array 102 and a second array 104. Additionally, it will be appreciated that regions or arrays are separated at an angle relative to other portions of the first array 102 and other portions of the second array 104 in some embodiments. For example, a first region 612 is at an angle to a second region 614, by comparison to the first array 102 and the second array 104, separated by dummy region 616 and additional dummy region 618. In some embodiments, first region 102 is substantially similar, and corresponds to first region 612. Similarly, second regions 104 and 614, dummy regions 206 and 616, and additional dummy regions 208 and 618 correspond in an according manner. In some embodiments, the dummy regions 206 and 616 and the additional dummy regions 208 and 618 are 5 um wide. However, it will be appreciated that dimensions associated with any of the dummy regions, including the additional dummy regions are adjustable based on design rules.

In some embodiments, the graded pattern density 216 and additional graded pattern density 218 are based on pattern densities of surrounding and/or adjacent regions. For example, in some embodiments, the graded pattern density 216 is based at least in part on the first pattern density 112 and the additional graded pattern density 218. In another embodiment, the additional graded pattern density 218 is based at least in part on the second pattern density 114 and the graded pattern density 216. In this way graded dummy insertion is provided, and a buffer zone width associated with a distance between the first region 102 and the second region 104 is reduced.

Figure 7:
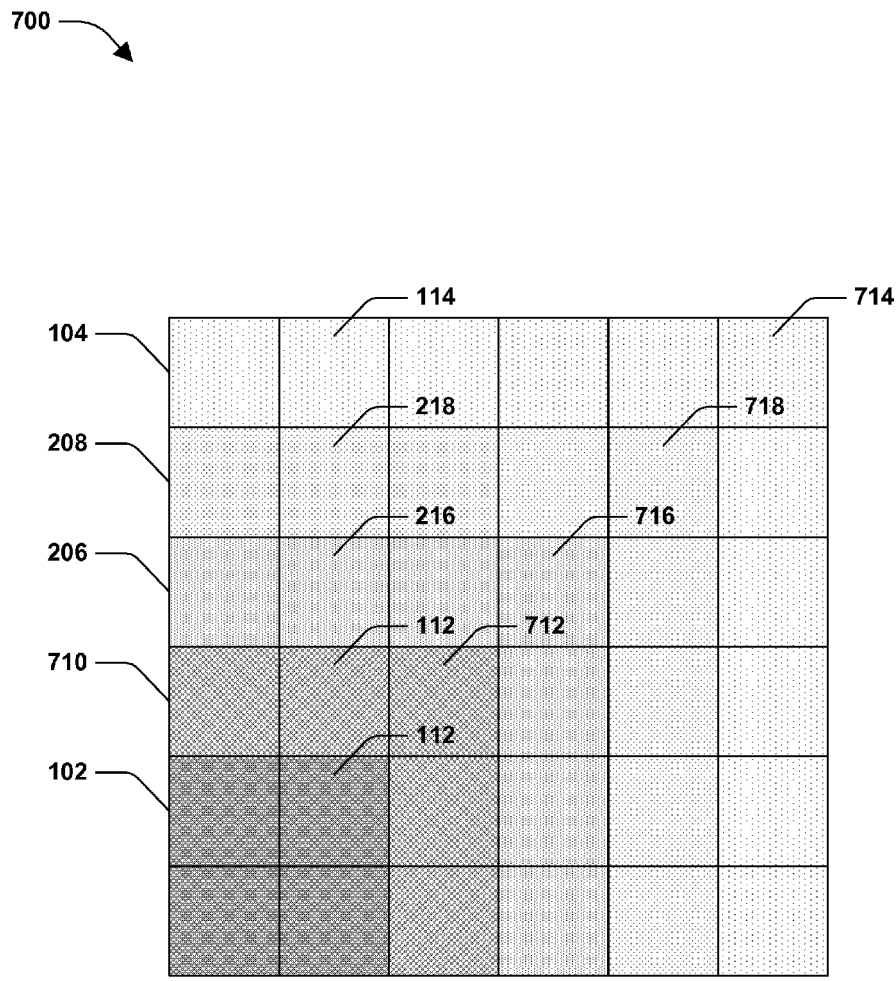
FIG. 7 is a top-down and/or layout view of an example array enhanced with graded dummy insertion, according to various embodiments.

FIG. 7 is a top-down and/or layout view of an example array 700 enhanced with graded dummy insertion, according to some embodiments. In some embodiments, the array 700 of FIG. 7 comprises three dummy regions inserted between a first region and a second region. It will be appreciated that respective dummy regions and regions comprise corresponding arrays, according to some embodiments. For example a first region 102 is enhanced by inserting graded dummies 710, 206, and 208 between the first region 102 and a second region 104. It will be appreciated that in some embodiments, regions 102, 710, 206, 208, and 104 are associated with pattern densities 112, 112, 216, 218, and 114, for example. Therefore, in this example, region 710 comprises a pattern density substantially similar to the pattern density 112 of the first region 102. It will be appreciated that in some embodiments, pattern densities 712, 716, 718, and 714 are different from pattern densities 112, 216, 218, and 114, respectively at least because pattern densities 712, 716, 718, and 714 comprise different surrounding pattern densities than pattern densities 112, 216, 218, and 114. For example, pattern density 216 has three "blocks" associated with pattern density 218 on one side, and three "blocks" associated with pattern density 112 on another side, while 716 has five "blocks" associated with pattern density 718 on one side and one block "block" associated with pattern density 712 on another side.

Figure 8:
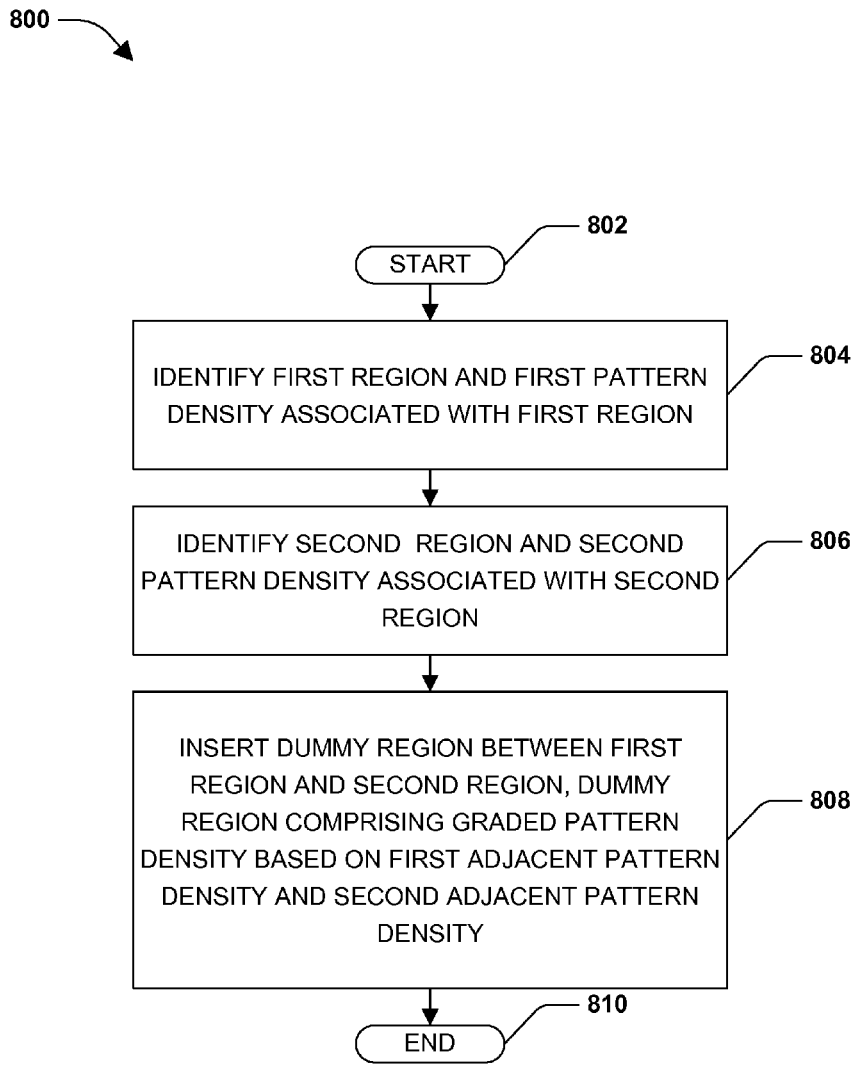
FIG. 8 is a flow diagram of an example method for graded dummy insertion, according to various embodiments.

FIG. 8 is a flow diagram of an example method 800 for graded dummy insertion, according to some embodiments. At 802, the method 800 begins, and at 804, a first region and a first pattern density associated with the first region are identified. At 806, a second region and a second pattern density associated with the second region are identified. At 808, a dummy region is inserted between the first region and the second region, the dummy region comprising a graded pattern density based at least in part on a first adjacent pattern density and a second adjacent pattern density. In some embodiments, a computer aided design (CAD) layer is associated with at least one of the first region, second region, the first pattern density, the second pattern density, the dummy region, and/or the graded pattern density.

In some embodiments, a design rule check is executed on the inserted dummy region and/or the graded pattern density associated with the dummy region. In an example, the design rule checks for a density gradient between the dummy region and at least one of the first region and the second region and flags the dummy region if the density gradient is greater than ten. According to another example, the design rule checks widths associated with the dummy region and/or additional dummy regions such that a sum of the dummy region widths does not exceed a threshold. In an example, a width of the dummy region is adjusted based at least in part on a design rule. For example, a design rule associated with a total dummy width of 15 um can adjust a number of dummy regions inserted and/or a width associated with an inserted dummy region such that the design rule is met. At 810, the method 800 ends. In this way, cells at an edge of at least one of the first region and/or the second region are mitigated from edge effects and/or device variation. Additionally, a buffer size associated with at least some of the dummy regions is reduced to enable efficient space management for a device.

Figure 9:
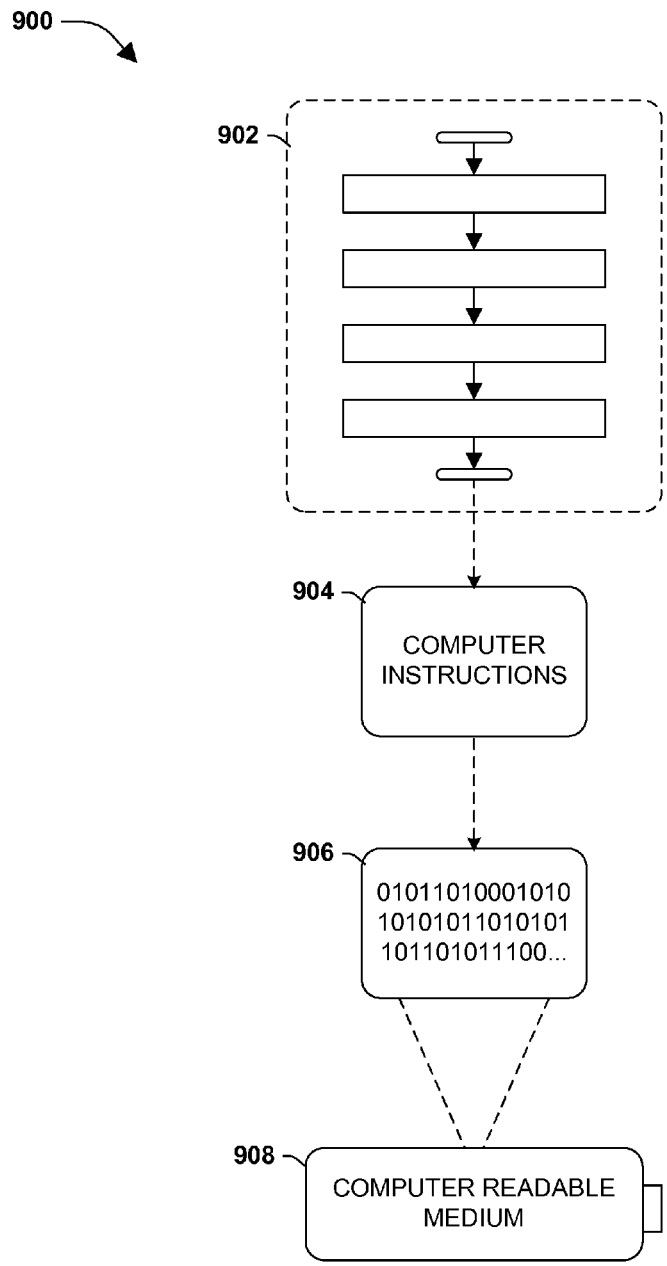
FIG. 9 is an illustration of an example computer-readable medium and/or computer-readable device comprising processor-executable instructions configured to embody one or more of the provisions set forth herein, according to various embodiments.

Still another embodiment involves a computer-readable medium comprising processor-executable instructions configured to implement one or more of the techniques presented herein. An example embodiment of a computer-readable medium and/or a computer-readable device that is devised in these ways is illustrated in FIG. 9, wherein the implementation 900 comprises a computer-readable medium 908, such as a CD-R, DVD-R, flash drive, a platter of a hard disk drive, etc., on which is encoded computer-readable data 906. This computer-readable data 906 in turn comprises a set of computer instructions 904 configured to operate according to one or more of the principles set forth herein. In one such embodiment 900, the processor-executable computer instructions 904 is configured to perform a method 902, such as at least some of the exemplary method 400 of FIG. 4 and/or at least some of exemplary method 800 of FIG. 8, for example. Many such computer-readable media are devised by those of ordinary skill in the art that are configured to operate in accordance with the techniques presented herein.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

As used in this application, the terms "component", "module," "system", "interface", and the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components residing within a process and/or thread of execution and a component may be localized on one computer and/or distributed between two or more computers.

Furthermore, the claimed subject matter is implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

Figure 10:
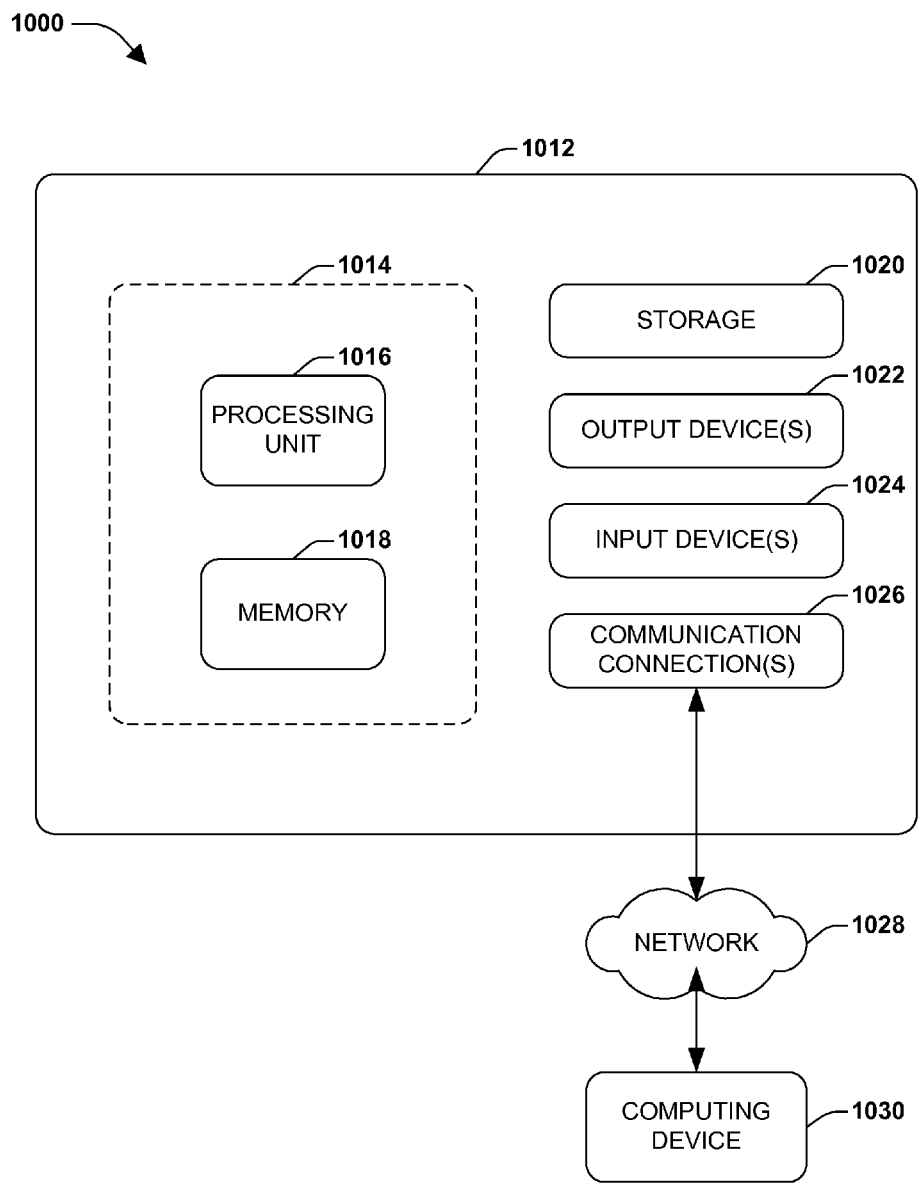
FIG. 10 is an illustration of an example computing environment where one or more of the provisions set forth herein are implemented, according to various embodiments.

FIG. 10 and the following discussion provide a brief, general description of a suitable computing environment to implement embodiments of one or more of the provisions set forth herein. The operating environment of FIG. 10 is only one example of a suitable operating environment and is not intended to suggest any limitation as to the scope of use or functionality of the operating environment. Example computing devices include, but are not limited to, personal computers, server computers, hand-held or laptop devices, mobile devices, such as mobile phones, Personal Digital Assistants (PDAs), media players, and the like, multiprocessor systems, consumer electronics, mini computers, mainframe computers, distributed computing environments that include any of the above systems or devices, and the like.

Although not required, embodiments are described in the general context of "computer readable instructions" being executed by one or more computing devices. Computer readable instructions are distributed via computer readable media as will be discussed below. Computer readable instructions are implemented as program modules, such as functions, objects, Application Programming Interfaces (APIs), data structures, and the like, that perform particular tasks or implement particular abstract data types. Typically, the functionality of the computer readable instructions are combined or distributed as desired in various environments.

FIG. 10 illustrates an example of a system 1000 comprising a computing device 1012 configured to implement one or more embodiments provided herein. In one configuration, computing device 1012 includes at least one processing unit 1016 and memory 1018. Depending on the exact configuration and type of computing device, memory 1018 may be volatile, such as RAM, non-volatile, such as ROM, flash memory, etc., or some combination of the two. This configuration is illustrated in FIG. 10 by dashed line 1014.

In other embodiments, device 1012 includes additional features and/or functionality. For example, device 1012 also includes additional storage such as removable storage and/or non-removable storage, including, but not limited to, magnetic storage, optical storage, and the like. Such additional storage is illustrated in FIG. 10 by storage 1020. In some embodiments, computer readable instructions to implement one or more embodiments provided herein are in storage 1020. Storage 1020 also stores other computer readable instructions to implement an operating system, an application program, and the like. Computer readable instructions are loaded in memory 1018 for execution by processing unit 1016, for example.

The term "computer readable media" as used herein includes computer storage media. Computer storage media includes volatile and nonvolatile, removable and non-removable media implemented in any method or technology for storage of information such as computer readable instructions or other data. Memory 1018 and storage 1020 are examples of computer storage media. Computer storage media includes, but is not limited to, RAM, ROM, EEPROM, flash memory or other memory technology, CD-ROM, Digital Versatile Disks (DVDs) or other optical storage, magnetic cassettes, magnetic tape, magnetic disk storage or other magnetic storage devices, or any other medium which can be used to store the desired information and which can be accessed by device 1012. Any such computer storage media is part of device 1012.

The term "computer readable media" includes communication media. Communication media typically embodies computer readable instructions or other data in a "modulated data signal" such as a carrier wave or other transport mechanism and includes any information delivery media. The term "modulated data signal" includes a signal that has one or more of its characteristics set or changed in such a manner as to encode information in the signal.

Device 1012 includes input device(s) 1024 such as keyboard, mouse, pen, voice input device, touch input device, infrared cameras, video input devices, and/or any other input device. Output device(s) 1022 such as one or more displays, speakers, printers, and/or any other output device are also included in device 1012. Input device(s) 1024 and output device(s) 1022 are connected to device 1012 via a wired connection, wireless connection, or any combination thereof. In some embodiments, an input device or an output device from another computing device are used as input device(s) 1024 or output device(s) 1022 for computing device 1012. Device 1012 also includes communication connection(s) 1026 to facilitate communications with one or more other devices.

According to an aspect, a method for graded dummy insertion associated with semiconductor fabrication is provided, comprising identifying a first region and a second region based at least in part on a density gradient between a first pattern density associated with the first region and a second pattern density associated with the second region. The method comprises inserting a dummy region between the first region and the second region, the dummy region comprising a graded pattern density based at least in part on a first adjacent pattern density and a second adjacent pattern density.

According to an aspect, an array enhanced with graded dummy insertion is provided, comprising a first array associated with a first pattern density, a second array associated with a second pattern density, and a dummy region between the first array and the second array. In some embodiments, the dummy region comprises a graded pattern density based at least in part on a first adjacent pattern density associated with a first adjacent region and a second adjacent pattern density associated with a second adjacent region. In some embodiments, the first adjacent region and the second adjacent region are adjacent to the dummy region.

According to an aspect, a computer-readable storage medium comprising computer-executable instructions, which when executed at least in part via a processing unit on a computer performs acts by identifying a first region and a first pattern density associated with the first region. In some embodiments, the computer readable storage medium identifies a second region and a second pattern density associated with the second region. In some embodiments, the computer readable storage medium inserts a dummy region between the first region and the second region. In some embodiments, the dummy region comprises a graded pattern density based at least in part on a first adjacent pattern density and a second adjacent pattern density.

Although the subject matter has been described in language specific to structural features and/or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein.

It will be appreciated that layers, features, elements, such as the first region, second region, dummy region(s), first adjacent region, second adjacent region, active region, gate region, identical dummy, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers features, elements, etc. mentioned herein, such as implanting techniques, doping techniques, spin-on techniques, sputtering techniques such as magnetron or ion beam sputtering, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used in either the detailed description or the claims, such terms are intended to be inclusive in a manner similar to the term "comprising".

Also, although the disclosure has been shown and described with respect to one or more implementations, equivalent alterations and modifications will occur to others skilled in the art based upon a reading and understanding of this specification and the annexed drawings. The disclosure includes all such modifications and alterations and is limited only by the scope of the following claims.

What is claimed is:

1. A computer-implemented method for graded dummy insertion associated with semiconductor fabrication, comprising:
   inserting, between a first region comprising one or more active cells and a second region, a first dummy region associated with a first graded pattern density that is less than a first pattern density associated with the first region; and
   inserting, between the first dummy region and the second region, a second dummy region associated with a second graded pattern density that is less than the first graded pattern density and greater than a second pattern density associated with the second region at least one of the inserting a first dummy region or the inserting a second dummy region implemented at least in part via a processing unit.

2. The method of claim 1, comprising inserting a third dummy region between the first dummy region and the second dummy region, the third dummy region associated with a third graded pattern density that is less than the first graded pattern density and greater than the second graded pattern density.

3. The method of claim 1, comprising determining at least one of the first graded pattern density or the second graded pattern density based at least in part on a linear function associated with the first pattern density and the second pattern density.

4. The method of claim 1, the second region comprising one or more surrounding patterns.

5. The method of claim 1, comprising determining a density gradient between the first region and the second region.

6. The method of claim 1, comprising calculating the first pattern density by dividing a sample area of the first region by a total gate area for the sample area of the first region.

7. The method of claim 5, the inserting a first dummy region and the inserting a second dummy region comprising inserting the first dummy region and inserting the second dummy region when the density gradient is greater than a density gradient threshold.

8. The method of claim 1, comprising executing a design rule check on at least one of:

the first dummy region and the first graded pattern density, or the second dummy region and the second graded pattern density.

9. The method of claim 1, comprising creating a computer aided design (CAD) layer associated with at least one of the first region, the second region, the first dummy region, or the second dummy region.

10. The method of claim 1, comprising adjusting a width of at least one of the first dummy region or the second dummy region based at least in part on a design rule.

11. An array enhanced with graded dummy insertion, comprising:
- a first array comprising one or more active cells and associated with a first pattern density;
- a second array associated with a second pattern density that is less than the first pattern density;
- a first dummy region between the first array and the second array, the first dummy region associated with a first graded pattern density that is less than the first pattern density; and
- a second dummy region between the first dummy region and the second array, the second dummy region associated with a second graded pattern density, the second graded pattern density less than the first graded pattern density and greater than the second pattern density.

12. The array of claim 11, comprising a third dummy region between the first dummy region and the second dummy region, the third dummy region associated with a third graded pattern density that is less than the first graded pattern density and greater than the second graded pattern density.

13. The array of claim 11, at least one of the first graded pattern density or the second graded pattern density based at least in part on a linear function associated with the first pattern density and the second pattern density.

14. The array of claim 11, at least one of:
- the first pattern density corresponding to a first gate density, or
- the second pattern density corresponding to a second gate density.

15. The array of claim 11, the second array comprising one or more surrounding patterns.

16. The array of claim 11, at least one of:
- the first pattern density corresponding to a first metal layer pattern density, or
- the second pattern density corresponding to a second metal layer pattern density.

17. A non-transitory computer-readable storage medium comprising computer-executable instructions that when executed perform a method, comprising:
- identifying a first region associated with a first pattern density and comprising one or more active cells;
- identifying a second region associated with a second pattern density, the second pattern density less than the first pattern density; and
- inserting, between the first region and the second region, a first dummy region associated with a first graded pattern density that is less than the first pattern density; and
- inserting, between the first dummy region and the second region, a second dummy region associated with a second graded pattern density that is less than the first graded pattern density and greater than the second pattern density.

18. The non-transitory computer-readable storage medium of claim 17, the method comprising inserting a third dummy region between the first dummy region and the second dummy region, the third dummy region associated with a third graded pattern density that is less than the first graded pattern density and greater than the second graded pattern density.

19. The non-transitory computer-readable storage medium of claim 17, the method comprising determining a density gradient between the first region and the second region by at least one of subtracting the first pattern density from the second pattern density or subtracting the second pattern density from the first pattern density.

20. The non-transitory computer-readable storage medium of claim 17, the second region comprising one or more surrounding patterns.

* * * * *